United States Patent
Ellis et al.

(10) Patent No.: US 8,294,539 B2
(45) Date of Patent: Oct. 23, 2012

(54) MICRO-ELECTRO-MECHANICAL SWITCH BEAM CONSTRUCTION WITH MINIMIZED BEAM DISTORTION AND METHOD FOR CONSTRUCTING

(75) Inventors: Denis Ellis, Limerick (IE); Padraig Fitzgerald, Co. Cork (IE); Jo-ey Wong, Wayland, MA (US); Raymond Goggin, Cork (IE); Richard Tarik Eckl, Munich (DE)

(73) Assignee: Analog Devices, Inc., Norwood, MA (US)

( * ) Notice: Subject to any disclaimer, the term of this patent is extended or adjusted under 35 U.S.C. 154(b) by 607 days.

(21) Appl. No.: 12/338,767

(22) Filed: Dec. 18, 2008

(65) Prior Publication Data

US 2010/0155202 A1 Jun. 24, 2010

(51) Int. Cl.
*H01H 51/22* (2006.01)
(52) U.S. Cl. .......................................... 335/78; 200/181
(58) Field of Classification Search .................... 335/78; 200/181
See application file for complete search history.

(56) References Cited

U.S. PATENT DOCUMENTS

| | | | |
|---|---|---|---|
| 5,455,723 A | 10/1995 | Boutaghou et al. | |
| 5,880,565 A | 3/1999 | Watanabe | |
| 6,396,368 B1 | 5/2002 | Chow et al. | |
| 6,525,446 B1 | 2/2003 | Yasuda et al. | |
| 6,577,975 B2 | 6/2003 | Chiesa | |
| 6,710,507 B2 | 3/2004 | Murphy | |
| 6,847,908 B2 | 1/2005 | Chawla | |
| 7,178,397 B2 | 2/2007 | Lee et al. | |
| 7,528,691 B2 * | 5/2009 | Wallis et al. | 335/78 |
| 7,719,162 B2 | 5/2010 | Min et al. | |
| 2003/0127698 A1 | 7/2003 | Lee | |
| 2003/0133252 A1 | 7/2003 | Fasen | |
| 2004/0008097 A1 | 1/2004 | Ma et al. | |
| 2006/0006883 A1 | 1/2006 | Foote | |
| 2006/0115920 A1 | 6/2006 | Urano et al. | |
| 2007/0067127 A1 | 3/2007 | Bolz | |
| 2008/0151464 A1 | 6/2008 | Ellis et al. | |

OTHER PUBLICATIONS

PCT International Search Report for counterpart international application No. PCT/US2009/068249, mailed on Mar. 11, 2010.

* cited by examiner

*Primary Examiner* — Bernard Rojas
(74) *Attorney, Agent, or Firm* — Kenyon & Kenyon LLP

(57) ABSTRACT

Disclosed is a micro-electro-mechanical switch, including a substrate having a gate connection, a source connection, a drain connection and a switch structure, coupled to the substrate. The switch structure includes a beam member, an anchor and a hinge. The beam member having a length sufficient to overhang both the gate connection and the drain connection. The anchor coupling the switch structure to the substrate, the anchor having a width. The hinge coupling the beam member to the anchor at a respective position along the anchor's length, the hinge to flex in response to a charge differential established between the gate and the beam member. The switch structure having gaps between the substrate and the anchor in regions proximate to the hinges.

10 Claims, 12 Drawing Sheets

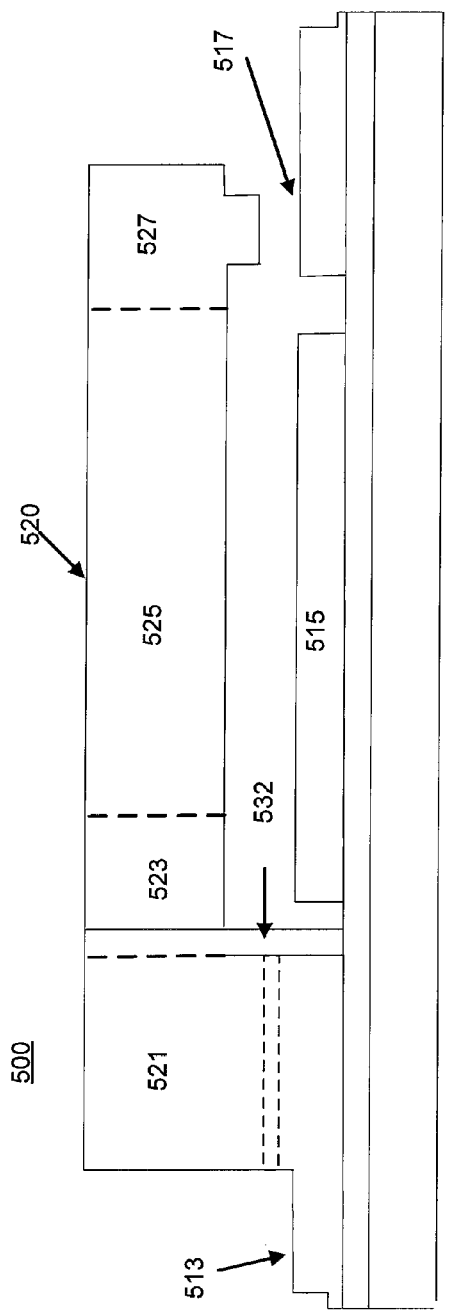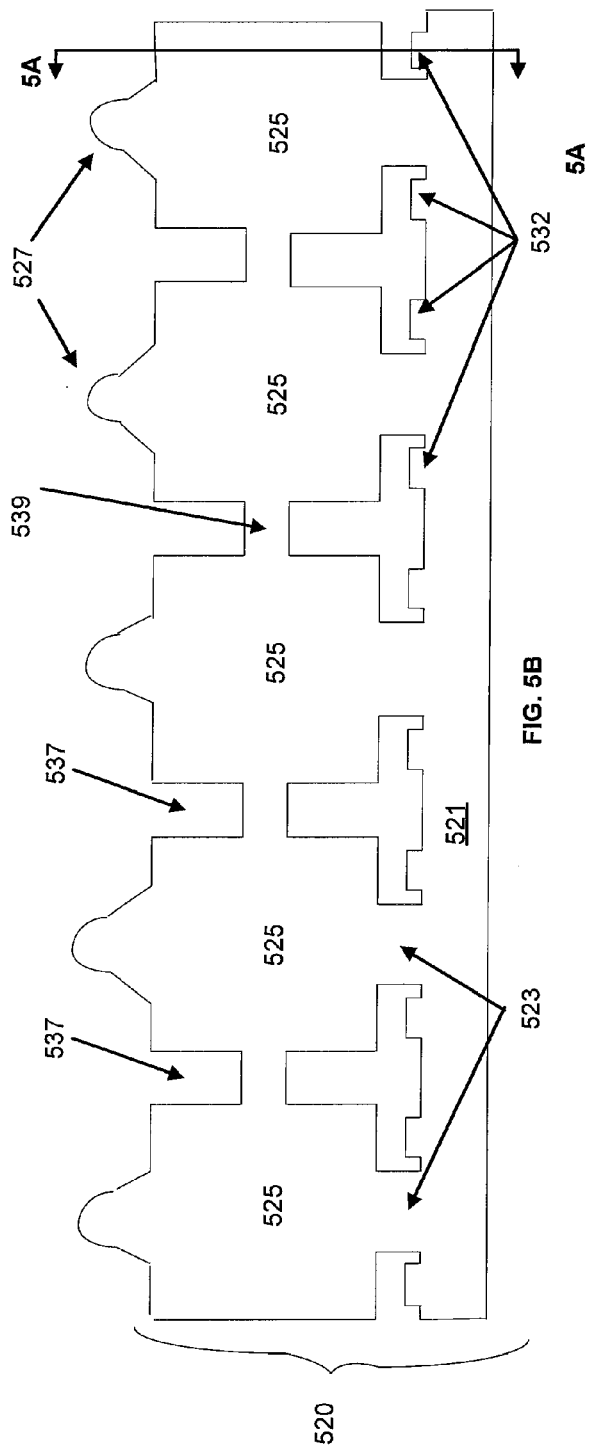
FIG. 5A
FIG. 5B

MICRO-ELECTRO-MECHANICAL SWITCH BEAM CONSTRUCTION WITH MINIMIZED BEAM DISTORTION AND METHOD FOR CONSTRUCTING

BACKGROUND

The present invention is directed to a micro-electro-mechanical switching (MEMS) device having a beam that is actuated in a manner similar to an electrical relay, and specifically, to such a MEMS device beam having structures, and constructed in a manner, to minimize the distortion of the beam when subject to thermal expansion.

Due to the small size of a MEMS device and the materials from which it is made, the parts of the device are subject to closer tolerances and experience the effects of the environment much more greatly than larger devices. The MEMS device is made, preferably, from gold because of its electrical conducting properties and silicon for suitability for integrated circuit fabrication. The gold and silicon have different properties and are affected by the environment in different ways. In particular, when a MEMS device is manufactured and operated, it is subject to a variety of environmental conditions, such as excessive heat. When subject to excessive heat, the gold and silicon from which a MEMS device are made expand at different rates, which can cause distortion in the structure of the MEMS device. This material expansion and resulting distortion can be compensated for during the design process but only to a certain degree.

For example, the linear expansion of a material due to temperature can be determined from $$\Delta L = \alpha \cdot L0 \cdot \Delta T$$

where $\alpha$ is the coefficient of thermal expansion, $L0$ is the length at the initial temperature, and $\Delta T$ is the change in temperature.

A configuration of a conventional MEMS switch is shown in FIG. 1 in a cross-sectional view. The MEMS switch 100 comprises a substrate 110 and a switch 120. The substrate 110 is formed from a semiconductor material such as silicon and coated with a dielectric material such as silicon dioxide or the like. The substrate 110 can also be a dielectric material such as sapphire or the like. The switch 120 includes an anchor 121, a hinge 123, a beam 125, and a tip 127. The anchor 121 couples the switch 120 to the substrate 110. The switch 120 also forms a current path or trace comprising the anchor 121, the hinge 123, the beam member 125, and the tip 127. The switch 120 is formed from gold, or some other suitable conductor. The current path via the anchor 121 is electrically connected to a source connection 113. The switch 120 is actuated by a voltage applied to a gate connection 115. The hinge 123 flexes in response to the charge differential established between the gate connection 115 and the beam member 125 by the applied voltage. In response to the flexing, the tip 127 contacts the drain connection 117, completing a current path from a source connection 113 to the drain 117. Of course, the source connection 113 and the drain connection 117 can be interchanged without substantially affecting the operation of the MEMS switch 110. As the electric field at the gate connection 115 dissipates, the beam 125 raises thereby lifting the tip 127 from the drain connection 117.

During manufacturing, the MEMS device 100 can be subjected to high heat, such as approximately 400° C., which may cause distortion of the components of the MEMS device 100. Also, in operation, the MEMS device 100 will begin to experience heat, or thermal effects, associated with the application of voltage at gate connection 115 and electrical current through the current path from source connection 113 to drain connection 117, as well as heat from other sources on the substrate 110 or nearby, or even from the environment. In some cases of distortion, the beam 125 will lower toward the gate 115 due to thermal expansion and the tip 127 will contact drain connection 117. In other cases, the beam 125 will distort such that the deflection of the tip 127 is different from that of neighboring tips. Such non-uniform deflection can be due to non-symmetric mechanical constraints, non-uniform fabrication process variations, other non-optimal operating conditions, other reasons, and/or combinations thereof. The non-uniform deflection may result, for example, in all tips 127 not making uniform contact, which can cause variations in the voltage required to actuate a particular switch in comparison to the voltage required to actuate other switches. Although described with respect to a single switch, it is understood that the MEMS device 100 can comprise more than one switch 120 on a substrate 100, and the above description should not be interpreted to be limited to a single switch.

At the gold-substrate interface at an anchor point in a MEMS device, there is a difference in thermal expansions. Gold expands at almost 5 times the rate of silicon, and nearly 10 times the rate of silicon dioxide (SiO2). So there is a thermal expansion differential at differing points, such as the anchor point, of the MEMS device, with gold expanding the most. For example, at the gold-substrate interface, gold expands by approximately 0.56% when a temperature of 400° C. differential is applied, while silicon expands by approximately 0.12%. The difference in thermal expansion causes a shear force between them which can contribute further to distortion in the MEMS device and possibly device failure.

Because the substrate will not bend in the normal bimetallic fashion due to its much larger mass (i.e., the whole wafer), it is expected the gold at the interface would expand approximately 0.12%, although under stress, whereas the gold at the top of the MEMS device would expand at approximately 0.56%. This thermal expansion mismatch between the top and the bottom of anchor 121 is problematic because the distortion of anchor 121 may cause displacements in the beam 120 and the tip 127. If the thermal displacement at the tip 127 equals the separation distance between the tip 127 and the drain 117, the source 113 and the drain 117 will become electrically short-circuited. Further distortion at the anchor 121 will induce mechanical stresses in the beam 120 and the tip 127. Again, distortion caused by thermal expansion can cause performance problems in the MEMS device 100.

Another problem resulting from unmitigated thermal expansion is a tendency of the beams 120 of MEMS devices to spread apart, in a shape similar to a hand-held fan, from one another in the horizontal plane. The spreading apart can cause misalignment of the components of the MEMS devices. Because of non-symmetric mechanical boundary conditions among the beams 120, such spreading apart will cause non-uniform tip displacements.

Accordingly, there is a need in the art to address the thermal expansion and distortion of the structures in the MEMS device, and thereby reduce complexity of associated circuitry that attempts to overcome the effects of the distortion.

BRIEF DESCRIPTION OF THE DRAWINGS

FIGS. 5A and 5B illustrate a buttress configuration of the anchor from a cross sectional view and from a top view of a MEMS device according to an exemplary embodiment of the present invention.

DETAILED DESCRIPTION

To overcome the problems associated with distortion caused by thermal expansion of components of the MEMS device, the disclosed construction can mitigate the effects of thermal expansion of the device, and provide a MEMS device having minimized distortion while maintaining its operating characteristics. This is accomplished by providing voids in an anchor behind a hinge of a MEMS device and reducing the quantity of mass of the anchor, both of which minimize the effects of thermal expansion.

Embodiments of the present invention relate to a micro-electro-mechanical switch, including a substrate having a gate connection and a drain connection and a switch structure, coupled to the substrate. The switch structure includes a beam member, an anchor and a hinge. The beam member having a length sufficient to overhang both the gate connection and the drain connection. The anchor coupling the switch structure to the substrate, the anchor having a width. The hinge coupling the beam member to the anchor at a respective position along the anchor's length, the hinge to flex in response to a charge differential established between the gate and the beam member. The switch structure having gaps between the substrate and the anchor in regions proximate to the hinges.

Other embodiments of the present invention relate to a method for constructing a micro-electro-mechanical device. A substrate is formed having a plurality of electrical connections including a source connection, a gate connection and a drain connection. An anchor is affixed to the substrate at a first point and a second point. The anchor can be electrically connected to the source connection. An air gap is formed at a location between the first point and the second point. A movable hinge connects to the anchor at a point diagonally opposite the air gap in the anchor. A beam is connected to the hinge, the beam having a width that is wider than the hinge, and configured to move when a voltage is applied to the gate connection. A contact tip is connected to the beam, opposite the hinge, that electrically contacts the drain connection thereby forming a current path formed from the source connection to the drain connection, when the beam moves in response to the voltage applied to the gate connection.

Figure 1:
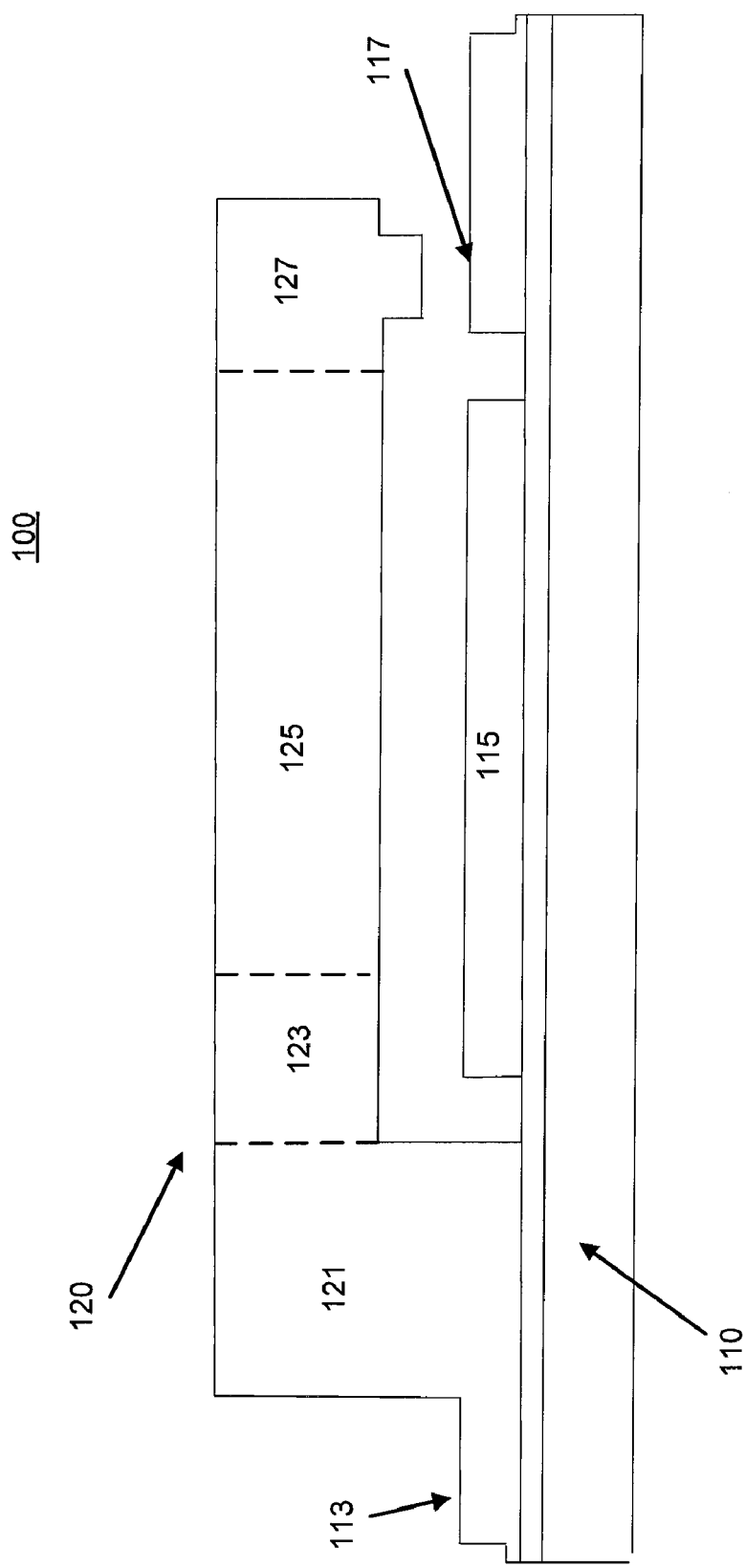
FIG. 1 illustrates a cross sectional view of a conventional MEMS device.
Figure 2:
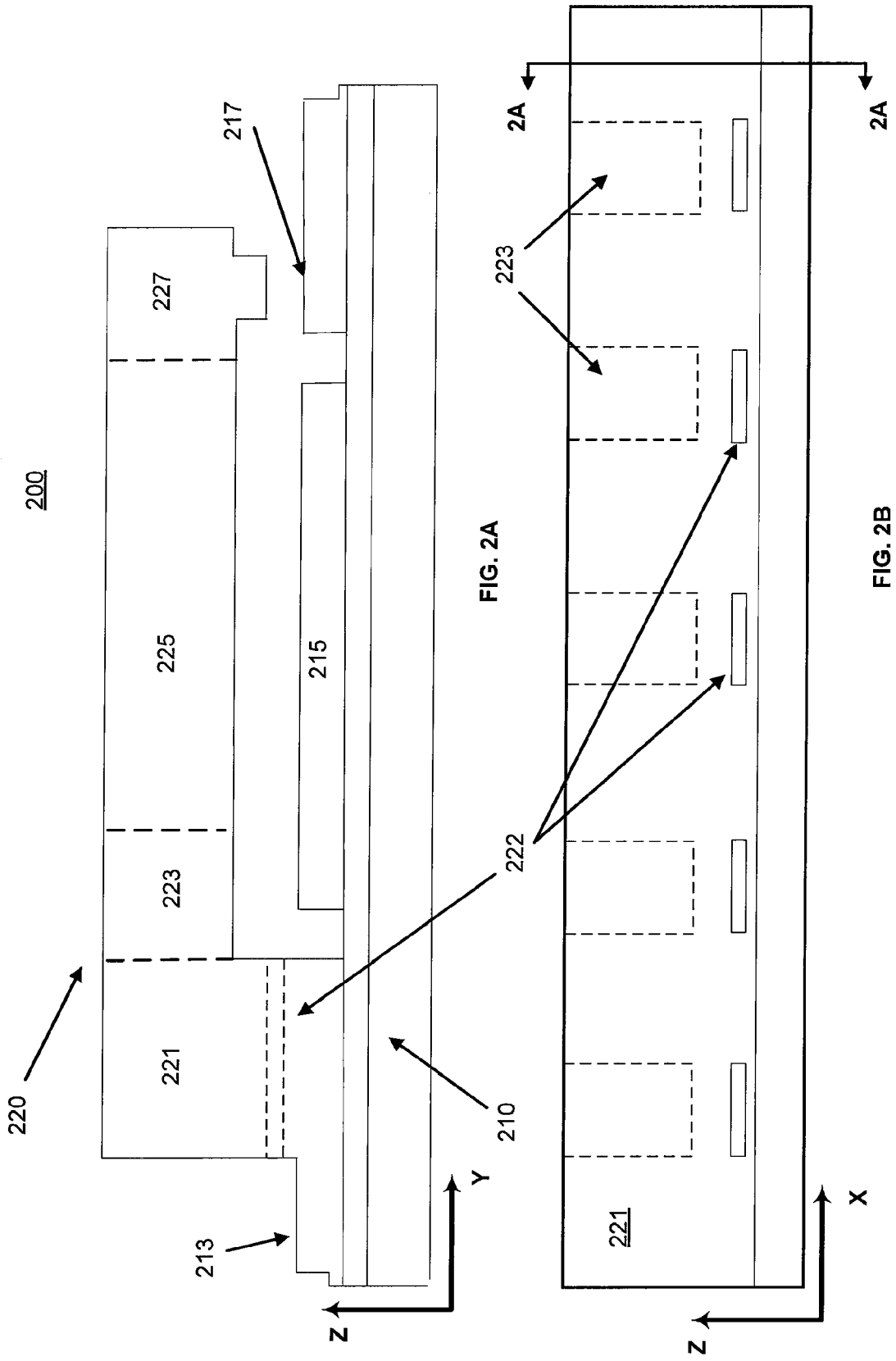
FIGS. 2A and 2B illustrate, respectively, a cross sectional view and a rear view of a MEMS device according to an exemplary embodiment of the present invention.

FIGS. 2A and 2B illustrate a configuration of a MEMS device according to an exemplary embodiment of the present invention. FIG. 2A illustrates a cross-sectional view of the MEMS device. The cross section of FIG. 2A is taken at sectional 2A shown in FIG. 2B. The MEMS device 200 comprises a substrate 210 and a switch 220. The switch 220 includes an anchor 221, a hinge 223, a beam 225, and a tip 227. The anchor 221 couples the switch 220 to the substrate 210. The switch 220 also forms a current path or trace comprising the anchor 221, the hinge 223, the beam member 225, and the tip 227. The switch 220 is formed from gold, or some other suitable conductor. The current path via the anchor 221 is electrically connected to a source connection 213.

The switch 220 is actuated by a voltage applied to a gate connection 215. The hinge 223 flexes in response to the charge differential established between the gate connection 215 and the beam member 225 by the applied voltage. In response to the flexing, the tip 227 contacts the drain connection 217, completing a current path from a source connection 213 to the drain 217. Of course, the source connection 213 and the drain connection 217 can be interchanged without substantially affecting the operation of the MEMS switch 210. As the electric field at the gate connection 215 is taken away, the beam 225 raises thereby lifting the tip 227 from the drain connection 217. The anchor 221 of the switch is configured to include a gap 222 that extends laterally through the anchor 221. The gap 222 can have the same dimensions from the rear of the anchor 221 to the front of the anchor 221. Of course, the dimensions of the gap 222 in anchor 221 may vary from wider to narrower and vice versa in all directions, i.e., front to rear, rear to front, up to down or down to up. Specifically, the gap 222 may have various heights in the Z-axis that extend from a point substantially co-planar with source connection 213 to a point co-planar with the bottom of hinge 223 and/or beam 225. In addition, the shape does not have to be rectangular, but may be circular, polygonal, cylindrical, triangular or any shape that provides suitable stress-relieving properties.

The gap 222 may be located beneath the hinge 223, but does not necessarily have to be located precisely beneath the hinge 223. The alignment of the gap 222 and the hinge 223 can be readily seen in FIG. 2B. FIG. 2B is a rear view of a MEMS device 200 according to an exemplary embodiment of the present invention. As illustrated in FIG. 2B, the gap 222 may be aligned to be substantially centered, although it is not required to be, in a vertical plane beneath the hinge 223. Other gap 222 configurations are possible, such as conical or cylindrical.

Figure 3:
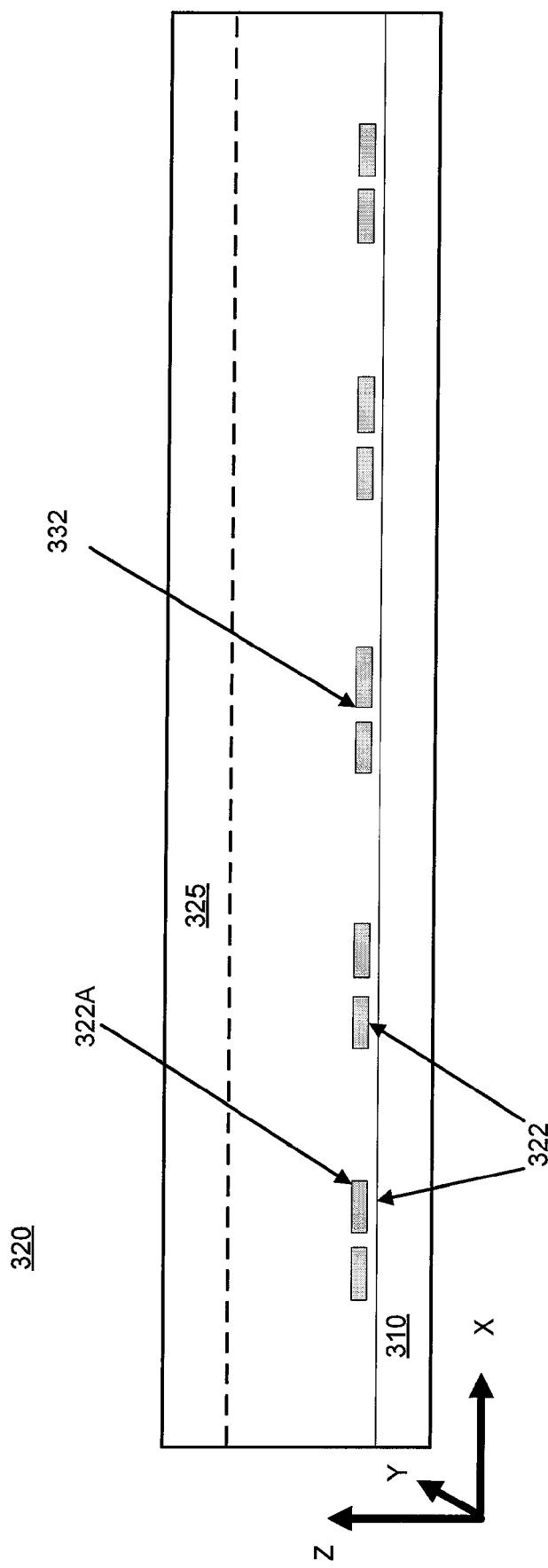
FIG. 3 illustrate a rear view of a MEMS device according to another exemplary embodiment of the present invention.

FIG. 3 illustrates another rear view of a MEMS device according to another exemplary embodiment of the present invention. In this embodiment, gaps 322 may be provided between the substrate 310 and the switch 320 in an area behind a beam 325. The gaps 322 need not be entirely void of interconnecting structures between the substrate 310 and a top surface of the gap 322A. Accordingly, the gap may include one or more center pillars 332, which assist to keep the top surface of the gap spaced from the substrate. The center pillars 332 are shown to be rectangular in shape, but can be a linear rib extending in the Y-axis. Alternatively, a rib may extend across a width of the gap 322 in the X-axis.

Figure 4:
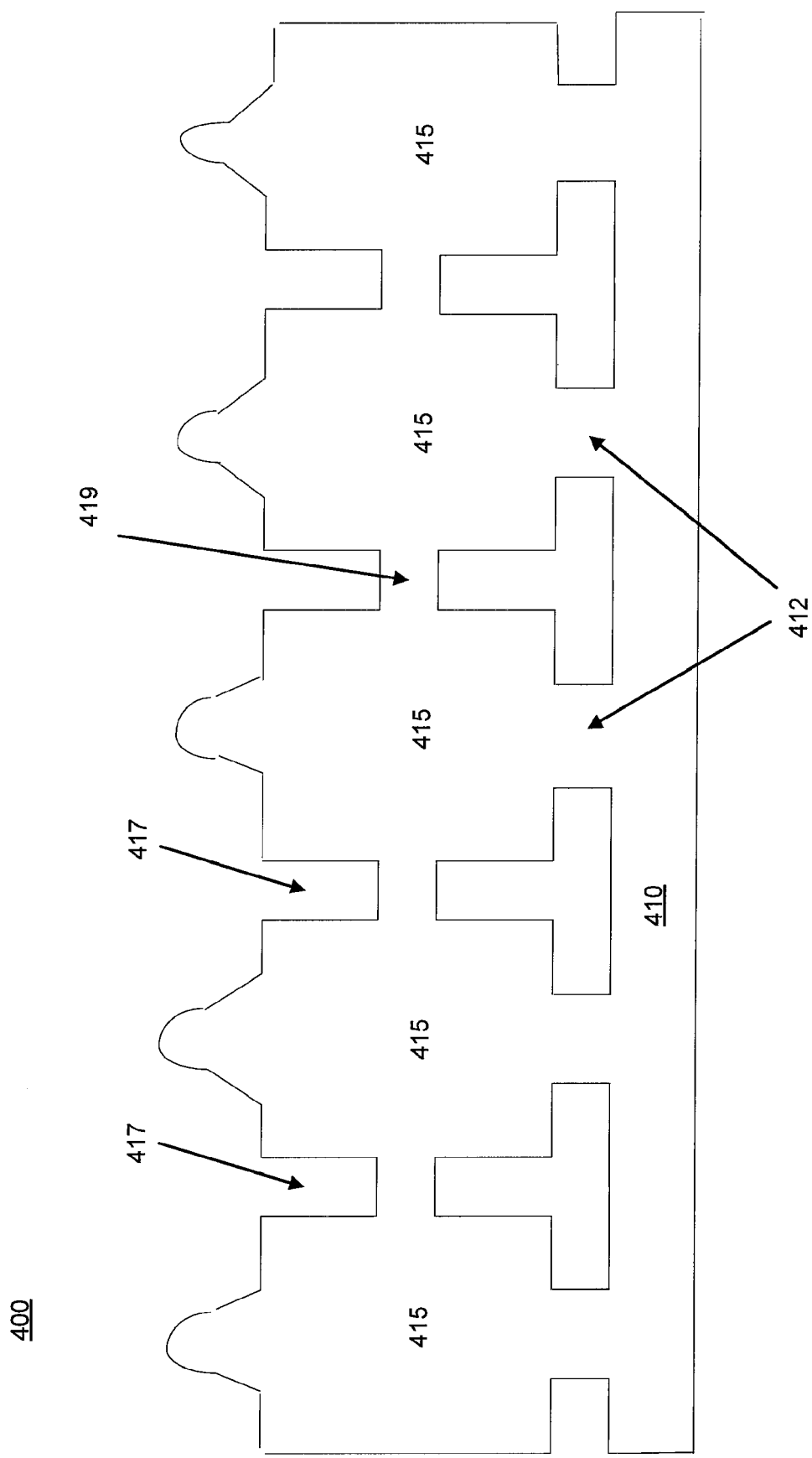
FIG. 4 illustrates a top view of a configuration of the beams of a MEMS device according to another exemplary embodiment of the present invention.

FIG. 4 illustrates a configuration of beams of a MEMS device from a top view of the MEMS device according to another exemplary embodiment of the present invention. The exemplary MEMS device 400 comprises an anchor 410, a plurality of hinges 412, a plurality of beams 415, a plurality of slots 417 and beam connection cross members 419. The slots 417 can be located between adjacent beams 415. When experiencing the stress of thermal loads, the illustrated configuration allows for expansion of a portion of the beams 415 into the slots 417. The beam connection cross members 419 connect adjacent beams 415 to one another and provide support of the beams 415 to provide structural support by minimizing, for example, any possible rotation, tilting or twisting of the beams 415. The beam cross connection members 419, although shown centered on beams 415, may be located at any point along the beams 415 in the Y-axis.

FIGS. 5A and 5B illustrate a buttress configuration of an anchor from a cross sectional view and from a top view of a MEMS device, respectively, according to an exemplary embodiment of the present invention. The cross section of FIG. 5A is taken at sectional 5A shown in FIG. 5B. The MEMS device 500 comprises a substrate 510 and a switch 520. The switch 520 comprises an anchor 521, a gap 522, a hinge 523, a beam 525 and a tip 527 similar to those discussed above with respect to FIGS. 1-4. The anchor 521 further comprises a buttress 532. As illustrated in FIG. 5A, the buttress 532 extends from the top e of the anchor 521 to the substrate 510, and is on the side of the anchor 521 closer to the hinge 523 and beam 525.

In the absence of the buttress 532, the material forming the top (i.e., the highest point in the Z-axis) of the anchor 521 can expand, when subject to the thermal stresses, in the direction of the beam 525 resulting in a rolling action of the anchor 521. The rolling action may be toward the beam 525. The buttress 532 serves to allow for expansion of the anchor 521, but also serves to block the rolling forward of the anchor 521 and the resulting sagging of the beam 525. The additional mass provided by the buttress 532 of the anchor 521 assists in limiting the amount of expansion.

Although shown in FIG. 5B as two buttresses aligned side-by-side in a horizontal direction, the buttress 532 can, alternatively, be aligned one-above-the-other in a vertical direction. Of course, the buttress 532 be a single buttress or more of the same or different sizes and shapes. Furthermore, as illustrated the buttress 532 is shown having a rectangular shape, however, the buttress can have 532 any shape such as curved, saw-toothed, sinusoidal, polygonal and the like, suitable for providing additional structural support for mitigating distortion within the MEMS device 500.

Also shown in FIG. 5B are beam connection cross members 539 that connect beams 525. Although shown substantially at the midpoint of the beams 525, the beam connection cross members 539 may be located at any point along the beam 525 between the tip 527 and hinge 523. The beam connection cross members 539 may act to provide a restoring force to the beams 525, thereby aiding in maintaining proper positioning of the beams 525. Locating the beam connection cross members 539 closer to the tip provides additional stress relief, and allows the material from which the beams 525 is formed to expand into beam slots 537.

Figure 6:
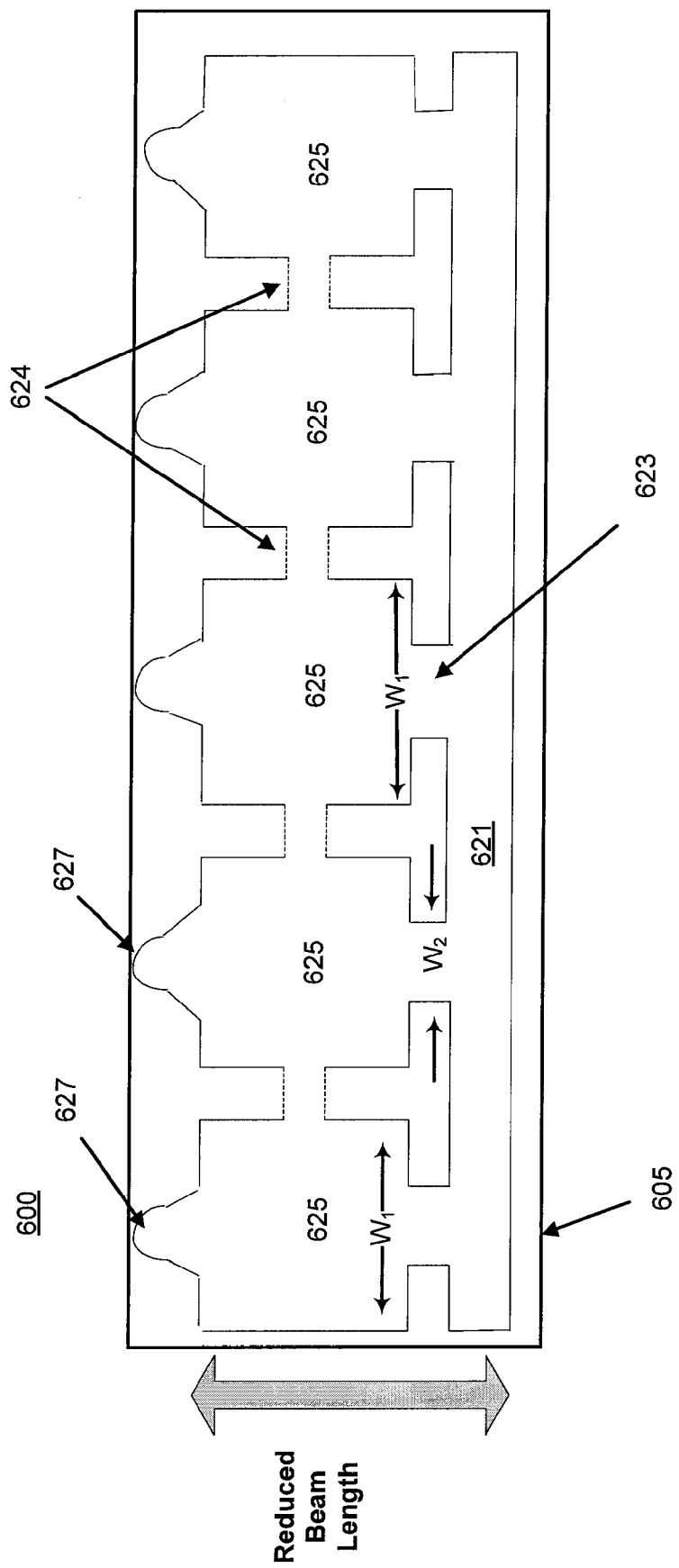
FIG. 6 is a top-view of an exemplary configuration of the anchor of a MEMS device according to an embodiment of the present invention.

FIG. 6 illustrates a top-view of a configuration of a beam of a MEMS device according to another exemplary embodiment of the present invention. In the embodiment illustrated in FIG. 6, the MEMS device 600 comprises a substrate 605, an anchor 621, a hinge 623, a beam 625, a tip 627 and an optional beam connection cross member 624. The beam 625 has a length that is reduced in comparison to the beams illustrated in the embodiments of FIGS. 1-5. It is preferable that the beam 625 have a length of approximately 50 micrometers, which is less than the length of the beam s in the embodiments of FIGS. 1-5. The beams 625 in the embodiments of FIGS. 1-5 are approximately 100 micrometers. The reduced length and reduced mass of the beam 625 of the present embodiment facilitates a structurally more rigid beam with less beam cantilevered from the hinge 623. The reduced cantilever reduces stress on the hinge 623 thereby limiting the effects of any thermal expansion.

In addition, the width $W_1$ of beam 625 may also vary and the width $W_2$ may also vary. The width $W_1$ may be either greater or equal to the width $W_2$. Furthermore, the optional beam connection cross members 624, if present, do not have to be centered on the beams 625, but may be located at any point along the beam 625 either closer to tip 627 or closer to hinge 623. In addition, the locations or absence of optional beam connection cross members 624 may alternate from one beam to the next beam across MEMS device 600.

Figure 7:
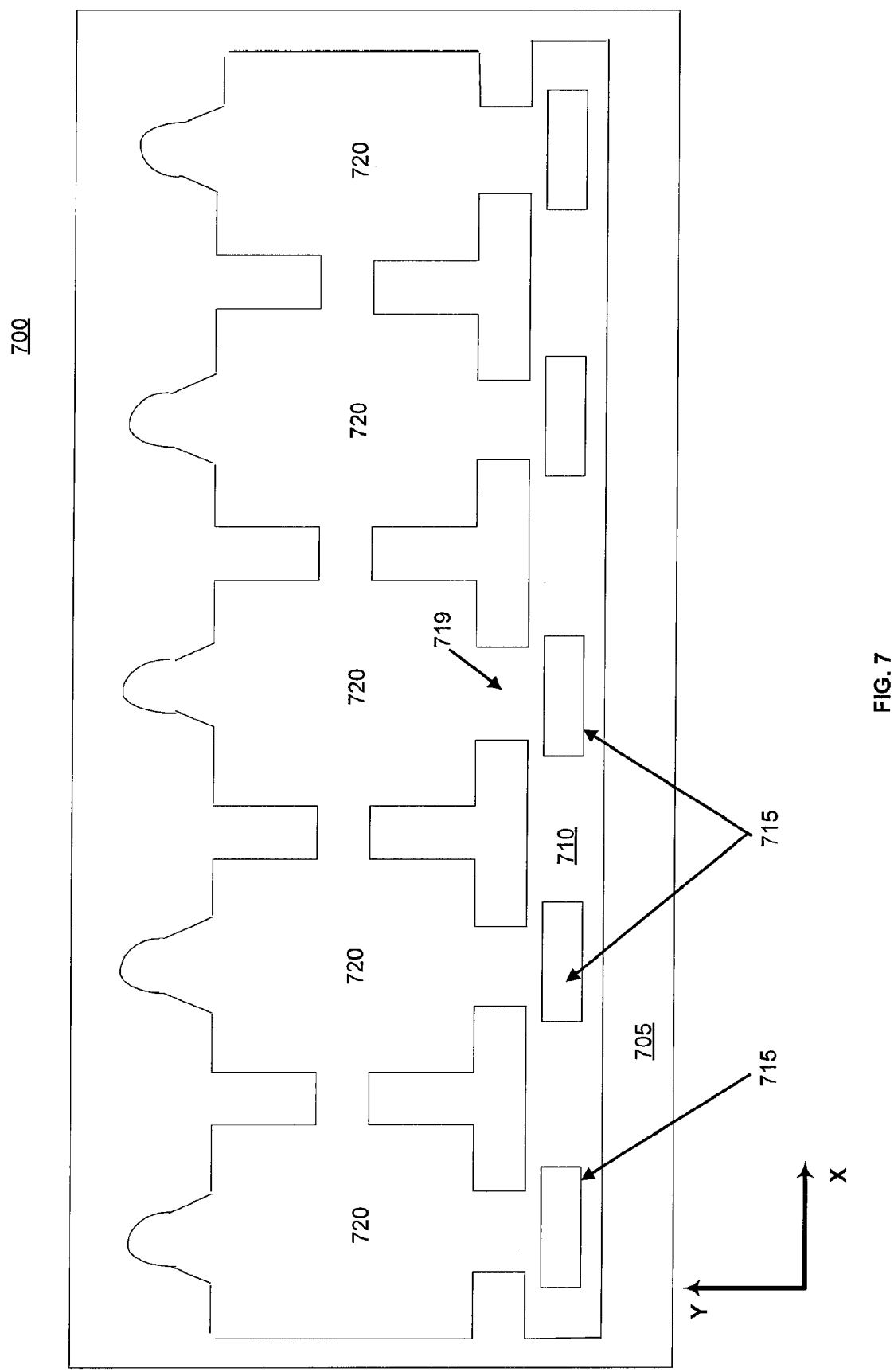
FIG. 7 illustrates a top-view of an exemplary configuration of a beam of a MEMS device according to an embodiment of the present invention.

FIG. 7 is a top-view of a configuration of the anchor of a MEMS device according to an exemplary embodiment of the present invention. The MEMS device 700 comprises a substrate 705 and an anchor 710. The anchor 710 includes anchor slots 715 and beam 720. The beam 720 interfaces with the anchor 710 via the hinge 719. The anchor slots 715 reduce the amount of mass of the anchor 710, thereby limiting the amount of material that can expand. In addition, the anchor 710 can expand into the anchor slots 715. This reduces the distortion of the anchor 710 and the hinge 719 and, as a result, reduces the tilting, either down or up, of the beams 720.

The anchor slots 715 are preferably substantially aligned with hinges 719, and extend to the substrate 705. Of course, the dimensions of the anchor slot 715 may vary from wider to narrower and vice versa in all directions, i.e., top-to-bottom or bottom-to-top. In addition, the shape of the anchor slot 715 does not have to be rectangular, but can be circular, polygonal, cylindrical, triangular or any shape that provides suitable stress-relieving properties, nor do the anchor slots 715 have to be of uniform size. It is also envisioned that the anchor slots 715 can be various shapes and sizes, or uniform shapes and sizes, or a combination of both in the exemplary embodiments. Furthermore, the anchor slot 715 does not have to be a single slot aligned with the hinge 720, but can be a plurality of anchor slots 715 substantially aligned with the hinge 720 or in a number of different locations in the anchor 710, or a combination of both. The anchor slot 715 does not have to be located directly behind hinge 719. By minimizing the mass of the anchor 710, the gold, or other material, from which the anchor 710 is made does not expand as much. Furthermore, the anchor slots 715 provide additional space into which the gold or other material can expand.

Figure 8:
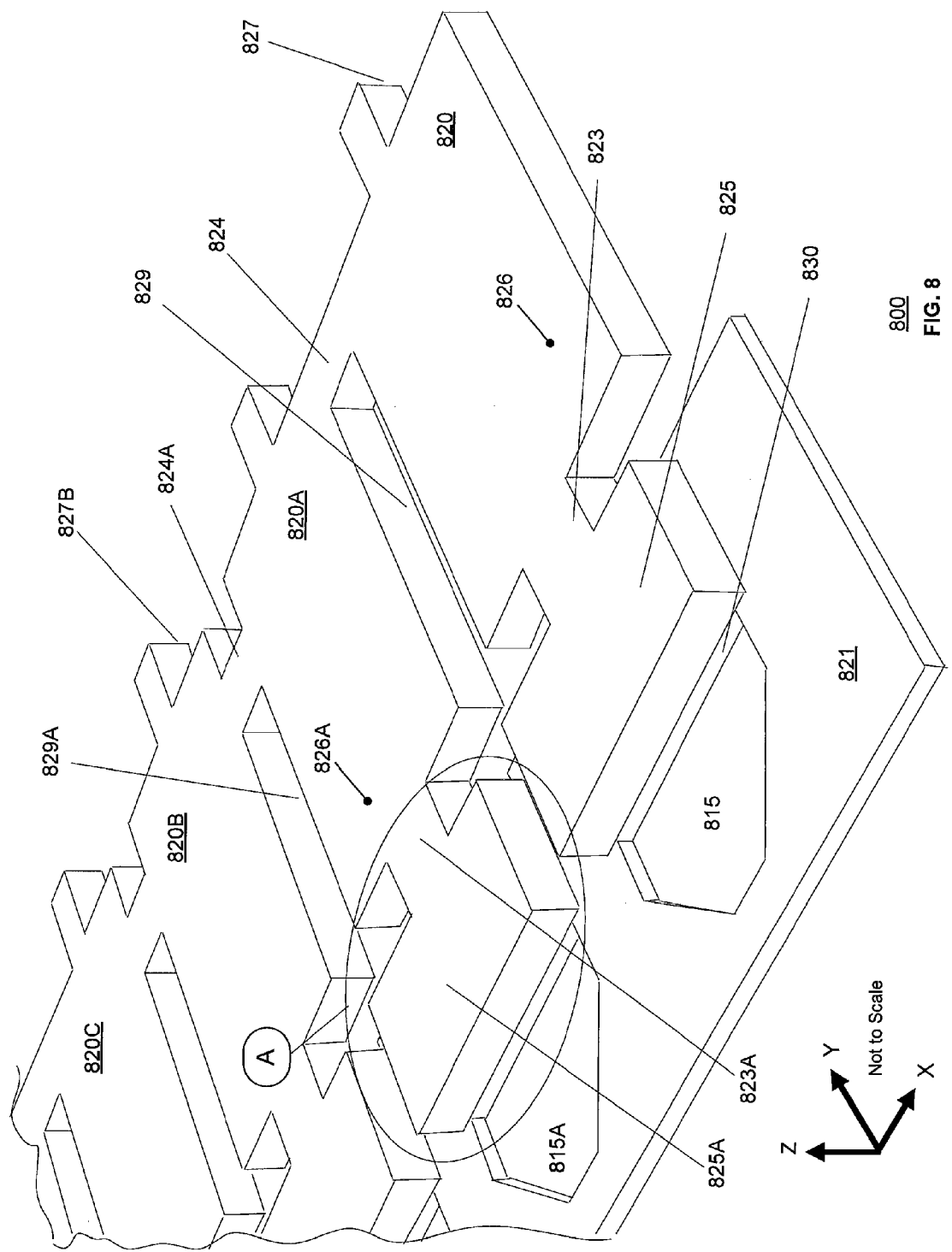
FIG. 8 illustrates a three-dimensional plane view of an exemplary configuration of the beam and anchor of a MEMS device according to another embodiment of the present invention.

In another embodiment, the anchor 821 includes a U-shaped anchor slot 815. In FIG. 8, the MEMS device 800 comprises a switch 820 and an anchor 821. The switch 820 comprises an anchor beam interface 825, a hinge 823, a beam 826, a beam cross connection member 824, a tip 827 and an anchor airbridge tie 830. The anchor beam interface 825 is the attachment point for the hinge 823 to the anchor 821. The hinge 823 extends, in the Y axis, between the anchor beam interface 825 to connect with beam 826 including expansion hole 828. The beam 826 is connected to an adjacent beam 826A by a beam cross connection member 824. As illustrated, switch 820A can be connected to yet another switch 820B by another beam cross connection member 824A, which in turn is connected to a further switch 820C.

Due to the high heat that the switch 820 experiences during manufacturing and operation, the anchor 821 and other portions of switch 820 may expand and may reduce the size of the U-shaped anchor slot 815, this aids in preventing warping and other detrimental effects to the beam 826. Thereby allowing the MEMS device 800 to operate properly. Cross connection member 824 connects switch 820 to switch 820A at beam 826 and beam 826A. Switch 820A comprises, similar to switch 820, a common anchor 821, an anchor slot 815A, a beam 826, a hinge 823, a beam interface 825A, and a tip 827. Switches 820B and 820C are similarly constructed. The beam cross connection member 824 improves the structural stability of the beams by aiding in mitigating the effects of the thermal expansion to which the MEMS devices are subjected. Beam cross connection members 824 and 824A may have different positions from beam-to-beam along the beams 826 and 826A. The position of beam cross connection members 824 and 824A influence the dimensions of beam slot 829 located between the beams 826 and 826A and beam slot 829A between beams 826A and 826B. The length of the beam slots 829 and 829A may be measured from the beam cross connection member 824 to the end of the beam 826 at the point where hinge 823 interfaces with the beam 826 in the Y-axis. Positioning the beam cross connection member 824 closer to the end of the beam 826 near tip 827 mitigates the thermal effects and stresses on hinge 823 better than positioning the beam cross connection member 824 closer to the hinge 823. As shown in FIG. 8, the beam cross connection members 824 and 824A may alternately be positioned further away from hinge 823 when connecting beam 826 to beam 826A, and closer to hinge 823A when connecting beam 826A to beam 826B. Additionally, beam cross connection members 824 and 824A aid in providing a restoring force to the beams 826 and 826A to maintain proper alignment and tip 827 displacement. The dimensions of beam cross connection members 824 and 824A in the X-axis may also be approximately 2-25 micrometers. The sectional view A illustrates the structure of the beam interface 825A and the anchor 821. Illustrated with the switch removed, the configuration of the anchor 821 comprises U-shaped anchor slots 815 and an anchor airbridge tie 830 is revealed.

Figure 9:
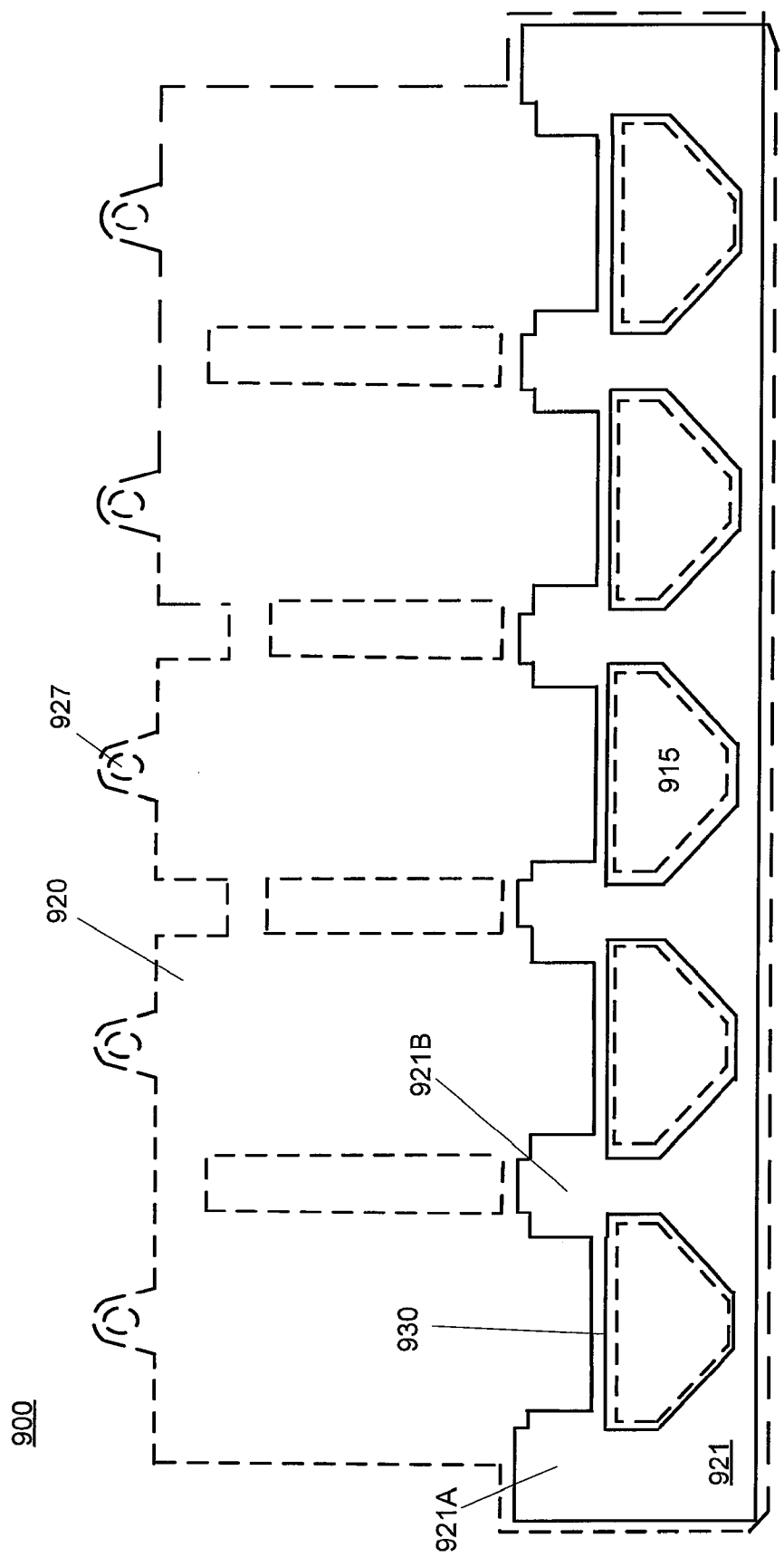
FIG. 9 illustrates a plan view of an exemplary configuration of an anchor airbridge tie shown according to an embodiment of the present invention.

FIG. 9 illustrates a plan view of an exemplary configuration of a slotted anchor and an anchor airbridge tie according to an embodiment of the present invention. The MEMS device 900 comprises a switch 920 and an anchor 921. The anchor 921 includes at least one anchor slot 915, and at least one anchor section 921A, at least one anchor section 921B, and at least one anchor airbridge tie 930. For purposes of the following discussion, beam 920 is shown in dashed lines since the focus of the discussion is the anchor 921, anchor slot 915 and the anchor airbridge tie 930. The anchor airbridge tie 930 spans anchor slot 915 tying together anchor sections 921A and 921B. An air gap can also be located beneath the anchor airbridge tie 930 to further increase space for thermal expansion of materials into anchor slot 915.

This structure can be formed of dual layers of gold. The beam 920 can be formed of gold and have a thickness of approximately 6 micrometers, while the anchor 921 can also be formed of gold and have a thickness of approximately 2 micrometers. This dual-thickness, dual layer configuration results in differing amounts of thermal expansion for the beam 920 as compared to the anchor 921. These dimensions are exemplary for purposes of discussion, and the exemplary embodiments are not limited to these dimensions. Of course, other materials or combinations of materials may be used to form the anchor, anchor airbridge tie, hinge and beam.

The anchor airbridge tie 930 may provide structural rigidity to the anchor 921 thereby allowing for thermal expansion of the gold material and mitigates warping of the beam 920. An additional feature of the embodiment shown in FIG. 9 is a beam 920 that has the same dimensions as the anchor 921, and can function without a hinge element.

Figure 10:
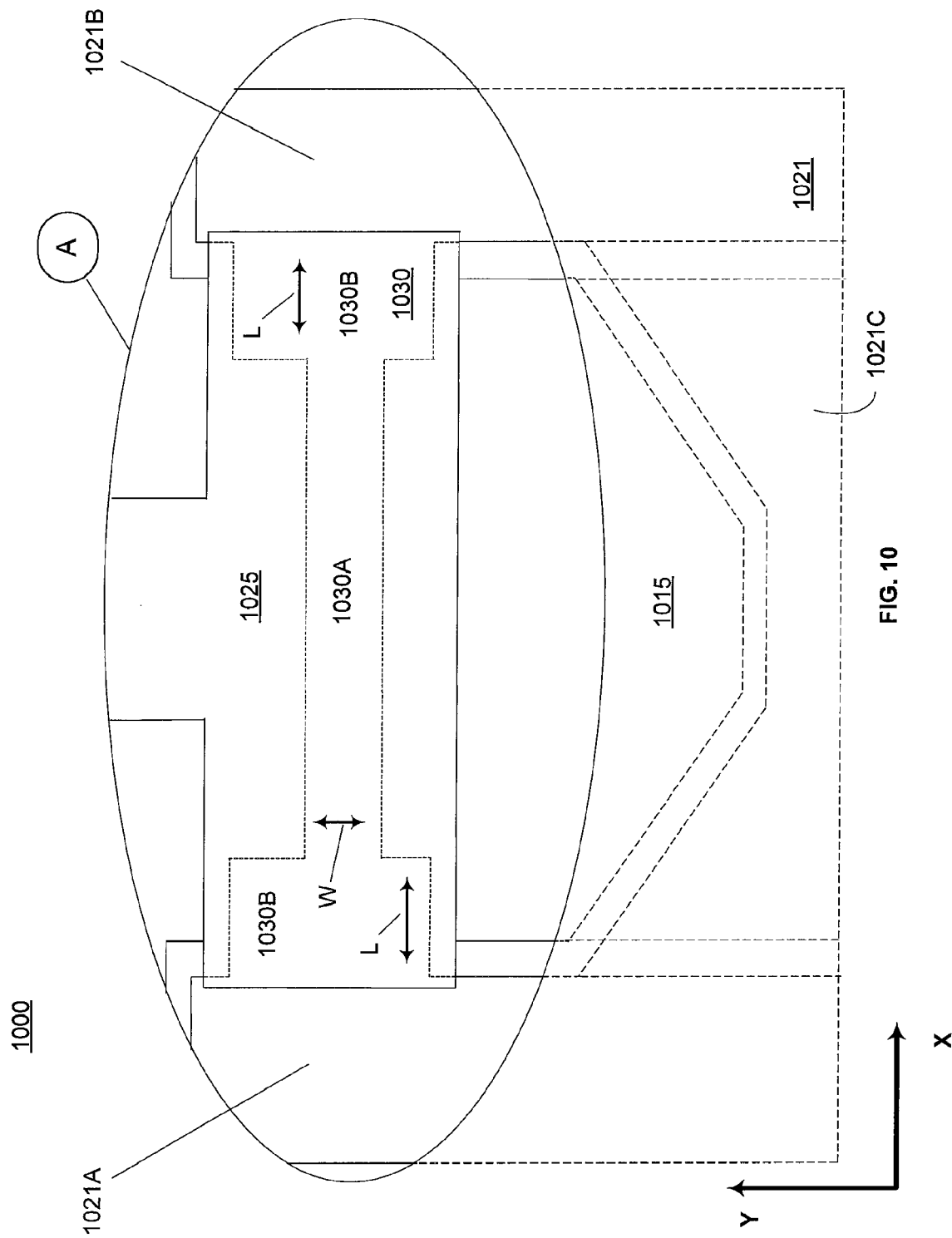
FIG. 10 illustrates a sectional view of an exemplary configuration of the anchor airbridge tie shown in FIG. 9 according to an embodiment of the present invention.

FIG. 10 illustrates a detailed sectional view of the exemplary anchor airbridge tie 930 shown in FIG. 9 according to an embodiment of the present invention.

Sectional view A of the MEMS device 1000 shows in detail an exemplary anchor 1021 and exemplary beam interface 1025. The anchor 1021 may be formed in various shapes, such as a U-shape or rectangular blocks, and comprises an anchor slot 1015, an anchor 1021, and anchor airbridge tie 1030. The anchor 1021 may include anchor sections 1021A, 1021B and, depending upon its configuration, optional anchor section 1021C. When the anchor slot 1015 is U-shaped, the anchor section 1021C may be integral with anchor sections 1021A and 1021B to form a monolithic anchor 1021. Alternatively, the individual anchor sections 1021A, 1021B and 1021C may be formed separately and configured as shown. The beam interface 1025 spans over the anchor airbridge tie 1030 and is supported by anchor sections 1021A and 1021B.

Anchor slot 1015 may be formed with an open end on both sides of the anchor sections 1021A and 1021B, and separates anchor section 1021A from anchor section 1021B. When the anchor 1021 is formed with only anchor sections 1021A and 1021B, the anchor airbridge tie 1030 connects the anchor section 1021A with anchor section 1021B by spanning anchor slot 1015. This forms a shape similar to the letter H. Optionally, the anchor slot 1015 may be formed to have a U-shape when anchor section 1021C fills the gap between anchor section 1021A and anchor section 1021B.

The dimensions of anchor airbridge tie 1030 may vary. As shown in FIG. 10, the anchor airbridge tie 1030 includes tie extension 1030A and tie wall 1030B. The width W of the anchor airbridge tie expansion 1030A can be varied to account for differences in the dimensions of a beam, a hinge, a hinge interface 1025, a beam cross connection member, an anchor or any combination thereof as well as to account for the thermal expansion of different materials used to construct a MEMS device 1000. The adjustment in width W is preferably in the Y-axis. However, adjustments in the X- or Z-axis can also provide substantial results. In addition, the length L of the tie wall 1030B may also be varied to provide additional stress relief properties to the beam and the hinge interface 1025. Further adjustments of the position of anchor bridge tie 1030 in the Y-axis with similar adjustments to the hinge interface 1025 along the anchor sections 1021A and 1021B may be made for a variety of reasons, such as providing additional stress relief or thermal properties.

Figure 11:
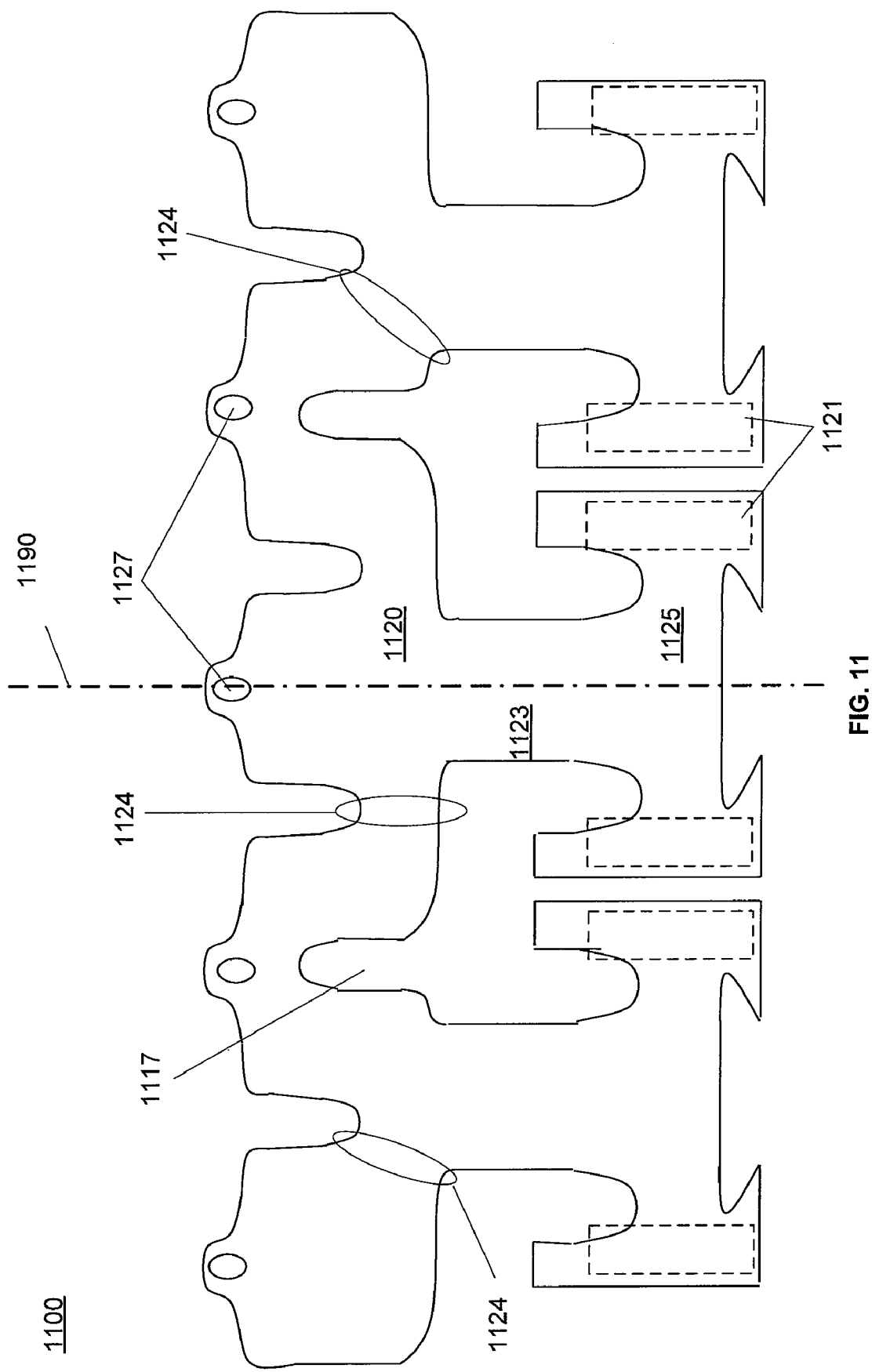
FIG. 11 illustrates a top-view of an exemplary configuration of a beam of a MEMS device according to yet another embodiment of the present invention.

FIG. 11 illustrates a top-view of an exemplary configuration of a beam of a MEMS device according to yet another embodiment of the present invention.

The configuration of MEMS device 1100 comprises anchors 1121 and beams 1120. The beams 1120 together form a flat spring having a thickness (in the Z-axis) of approximately 2-10 micrometers. The beam 1120 comprises a tip 1127, a hinge 1123, a beam cross connection member 1124 and a beam interface 1125. Similar to a spring, the beam 1120 expands and contracts according to the thermal expansion (and contraction) of the MEMS device 1100. Due to the beam thermal expansion slots 1117 can fill with gold as the gold forming the beams 1120 expand. The beam connection cross members 1124 can also expand into the beam thermal expansion slots 1117. In addition, the beam connection cross members 1124 provide additional structural support to maintain the alignment of tip 1127 with the contacts at the base (not shown). The flat spring shape of the beams 1120 is maintained by the beam cross connection members 1124, and the flat spring shape distributes stress throughout the beams 1120. Stress being equal to force over area. The beams 1120 expand into the beam thermal expansion slots 1117 which further reduces stress because the thermal expansion slots 1117 enable the material to move according to the force induced by the stress caused by thermal expansion. The beam cross connection members 1124 may also act to keep the individual beams 1120 from splitting apart. To maximize the stress reduction properties of this configuration, the beams 1120 of MEMS device 1100 are symmetrical around line 1190, which bisects the MEMS device 1100. Of course, asymmetrical beam configurations are also envisioned, and may provide stress reduction properties as well. Although MEMS device 1100 is shown with three hinges 1123, more or less hinges 1123 may be used.

Figure 12:
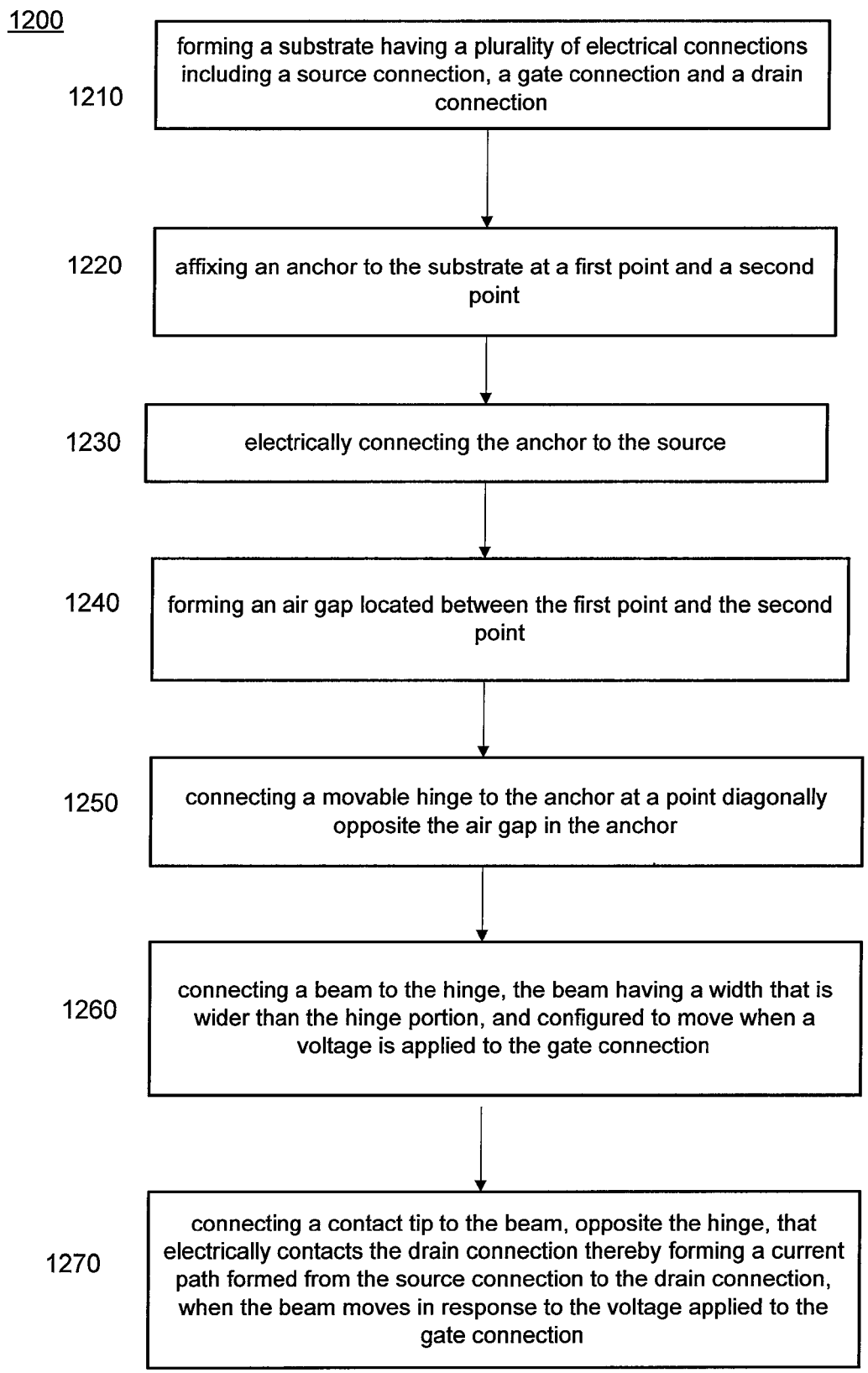
FIG. 12 illustrates a method for producing a switch according to an exemplary embodiment of the present invention.

FIG. 12 illustrates a method for producing a switch according to an exemplary embodiment of the present invention. The exemplary method of manufacturing or constructing a micro-electro-mechanical device will be described with reference to FIG. 12. In step 1210, a substrate is formed having a plurality of electrical connections including a source connection, a gate connection and a drain connection. An anchor is affixed, at step 1220, to the substrate at a first point and a second point. The anchor can be electrically connected, at step 1230, to the source connection. In step 1240, a gap is formed at a location between the first point and the second point. A movable hinge is connected, at step 1250, to the anchor at a point diagonally opposite the gap in the anchor. At step 1260, a beam is connected to the hinge, the beam having a width that is wider than the hinge, and configured to move when a voltage is applied to the gate connection. Step 1270 includes connecting a contact tip to the beam, opposite the hinge, that electrically contacts the drain connection thereby forming a current path formed from the source connection to the drain connection, when the beam moves in response to a voltage applied to the gate connection.

Those skilled in the art can appreciate from the foregoing description that the present invention can be implemented and constructed in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A micro-electro-mechanical switch device, comprising:
   a substrate having a gate connection, a source connection and a drain connection, and
   a switch structure, coupled to the substrate, comprising:
   a beam member having a length sufficient to overhang both the gate connection and the drain connection,
   an anchor coupling the switch structure to the substrate, the anchor having a length and width, and
   a hinge coupling the beam member to the anchor at a respective position along the anchor's length, the hinge to flex in response to a charge differential established between the gate and the beam member,
   the switch structure having a gap between the substrate and the anchor in regions proximate to the hinges and wherein the gap extends laterally through the anchor's length.

2. The device of claim 1, wherein the anchor includes a bottom surface that is coupled to the substrate, the bottom surface having a uniform area except for discontinuities associated with the gaps.

3. The device of claim 1, wherein the gap includes a pillar of anchor material that extends into the gap and is affixed to the substrate.

4. The device of claim 1, wherein the beam member comprises:
   multiple bodies of material each associated with a respective hinge and having a width wider than the respective hinge, and
   linking members coupling the bodies of material to each other.

5. The device of claim 1, wherein the anchor has a height corresponding to a distance of separation between the beam member and the gate connector, and
   a face surface comprising a plurality of buttress ribs provided in spaces between the hinges, the ribs projecting toward the gate connector.

6. The device of claim 1, wherein the anchor has a plurality of slots formed therein that extend from a top surface to a bottom surface thereof and are provided in spatial regions proximate to the respective hinges.

7. The device of claim 1, wherein the anchor includes a single slot formed therein that extends from a top surface to a bottom surface thereof, and is provided in a spatial region proximate to the respective hinge.

8. The device of claim 1, the switch structure further comprising materials that have a coefficient of thermal expansion different from the coefficient of thermal expansion of the substrate.

9. The device of claim 8, wherein the hinge is configured to direct shear forces due to thermal expansion away from the hinge.

10. The device of claim 1, the beam member comprising a tip having an electrical contact at the end of the beam opposite the hinge.

* * * * *